(12) United States Patent
Igarashi

(10) Patent No.: US 9,400,520 B2
(45) Date of Patent: Jul. 26, 2016

(54) TABLET TERMINAL ATTACHMENT

(71) Applicant: Power Support Co., Ltd., Tokyo (JP)

(72) Inventor: Katsushi Igarashi, Tokyo (JP)

(73) Assignee: Power Support Co., Ltd., Tokyo (JP)

( * ) Notice: Subject to any disclaimer, the term of this patent is extended or adjusted under 35 U.S.C. 154(b) by 0 days.

(21) Appl. No.: 14/427,240

(22) PCT Filed: Sep. 5, 2013

(86) PCT No.: PCT/JP2013/073882
§ 371 (c)(1),
(2) Date: Mar. 10, 2015

(87) PCT Pub. No.: WO2014/038613
PCT Pub. Date: Mar. 13, 2014

(65) Prior Publication Data
US 2015/0241918 A1    Aug. 27, 2015

(30) Foreign Application Priority Data

Sep. 10, 2012  (JP) .................................. 2012-198737
Apr. 4, 2013  (JP) .................................. 2013-078445

(51) Int. Cl.
*H04M 1/00* (2006.01)
*G06F 1/16* (2006.01)
(Continued)

(52) U.S. Cl.
CPC .......... *G06F 1/1626* (2013.01); *A44B 13/0094* (2013.01); *H04B 1/3888* (2013.01); *G06F 2200/1633* (2013.01); *Y10T 24/45021* (2015.01)

(58) Field of Classification Search
CPC . G06F 1/1626; A44B 13/0094; H04B 1/3888
USPC .............................................. 455/575.1, 575.8
See application file for complete search history.

(56) References Cited

U.S. PATENT DOCUMENTS

| 4,545,023 | A | * | 10/1985 | Mizzi | G06F 1/1626 345/173 |
| 4,855,725 | A | * | 8/1989 | Fernandez | G06F 3/147 345/173 |
| 5,915,873 | A | * | 6/1999 | Karlis | B42D 5/006 281/38 |

(Continued)

FOREIGN PATENT DOCUMENTS

| JP | S6232455 U | 2/1987 |
| JP | H03-74057 U | 7/1991 |

(Continued)

OTHER PUBLICATIONS

International Search Report dated Oct. 29, 2013 from corresponding International Patent Application No. PCT/JP2013/073882; 2pgs.

(Continued)

*Primary Examiner* — M D Talukder
(74) *Attorney, Agent, or Firm* — Maier & Maier, PLLC

(57) ABSTRACT

Provided is an attachment for use with tablet terminals which prevents a tablet terminal from unexpectedly popping up and allows a user to soon find the tablet terminal in a bag. An attachment for use with tablet terminals includes a terminal holding part configured to detachably hold a tablet terminal without hindering the user from operating the touchscreen surface of the tablet terminal and a ring insertion part which allows the terminal holding part to be held on a personal organizer including a ring.

5 Claims, 17 Drawing Sheets

(51) Int. Cl.
*A44B 13/00* (2006.01)
*H04B 1/3888* (2015.01)

(56) References Cited

U.S. PATENT DOCUMENTS

| | | | | |
|---|---|---|---|---|
| 6,183,157 | B1* | 2/2001 | Brown | B42F 13/40 206/311 |
| 6,200,056 | B1* | 3/2001 | Jordin | B42F 11/00 281/38 |
| 6,261,021 | B1* | 7/2001 | Pfanner | B42F 3/003 281/15.1 |
| 7,663,878 | B2* | 2/2010 | Swan | G06F 1/1632 361/679.3 |
| 7,905,672 | B2* | 3/2011 | Busam | B24B 45/00 401/195 |
| 8,142,096 | B2* | 3/2012 | Leung | B42F 13/16 402/4 |
| 8,594,755 | B1* | 11/2013 | Tages | H05K 5/03 206/304.2 |
| 2001/0040560 | A1* | 11/2001 | Amron | G06F 1/1626 345/169 |
| 2003/0150756 | A1* | 8/2003 | Kajiya | A45C 13/02 206/320 |
| 2004/0065568 | A1* | 4/2004 | Kim | G11B 33/0444 206/308.1 |
| 2007/0048079 | A1* | 3/2007 | Ng | B42F 13/26 402/70 |
| 2010/0310302 | A1* | 12/2010 | Leung | B42F 13/16 402/4 |
| 2011/0290687 | A1* | 12/2011 | Han | A45C 3/02 206/320 |
| 2014/0043748 | A1* | 2/2014 | Sartee | G06F 1/16 361/679.27 |
| 2015/0241918 | A1* | 8/2015 | Igarashi | G06F 1/1626 455/575.8 |

FOREIGN PATENT DOCUMENTS

| | | |
|---|---|---|
| JP | 3145420 U | 10/2008 |
| JP | 2009178373 A | 8/2009 |
| JP | 2010226203 A | 10/2010 |
| JP | 3170512 U | 9/2011 |
| JP | 2012043182 A | 3/2012 |
| JP | 3178403 U | 8/2012 |
| JP | 2012166401 A | 9/2012 |
| JP | 2014132372 U | 7/2014 |

OTHER PUBLICATIONS

Binder InsertCase for iPad [ online ], Jul. 23, 2012, Gigazine, searched on Oct. 15, 2013, URL: http://gigazine.net/news/20120723-binder-insert-case-for-iPad/.

Japanese Office Action dated Jun. 13, 2013 from corresponding Patent Application No. JP2013-078445; 6pgs.

Japanese Office Action dated Jul. 9, 2013 from corresponding Patent Application No. JP2013-078445; 8pgs.

* cited by examiner

FIG. 8
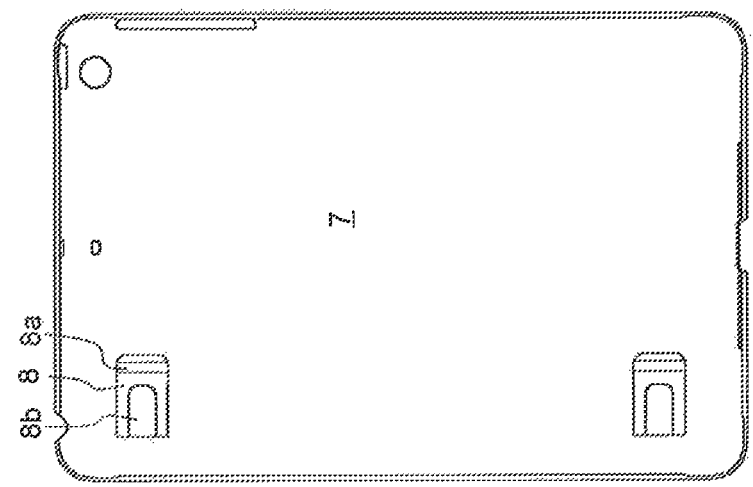
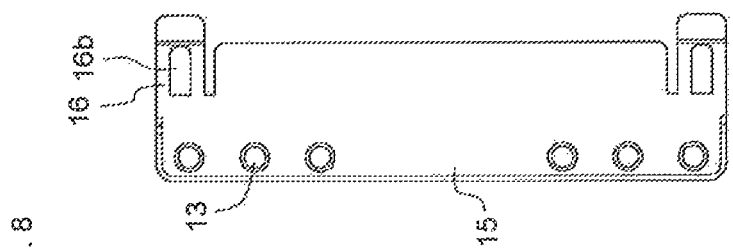

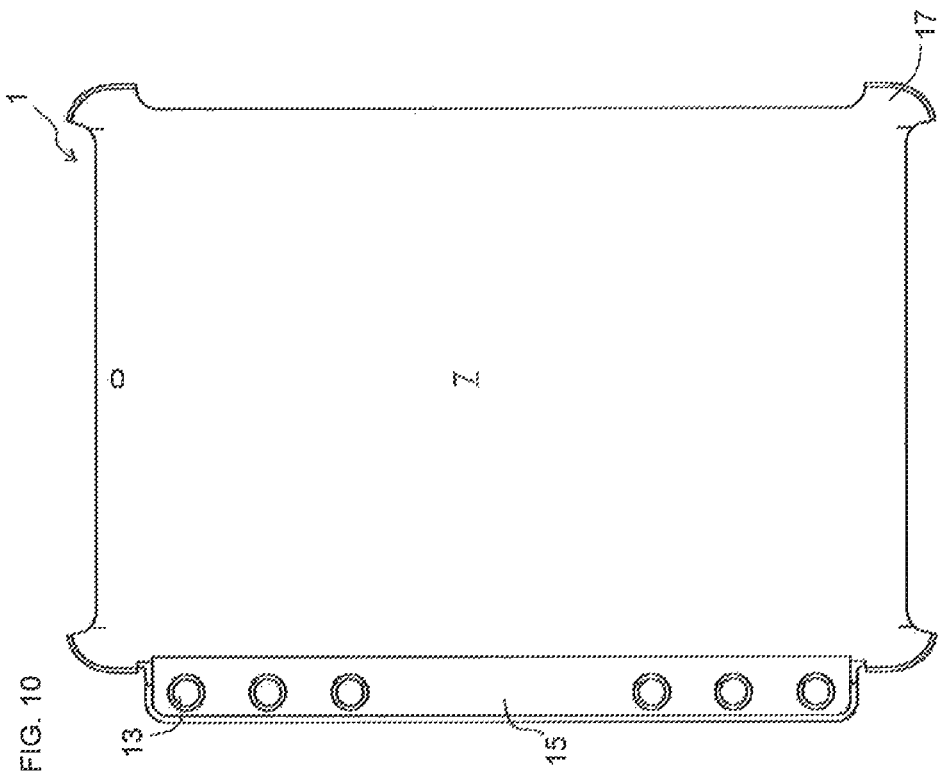
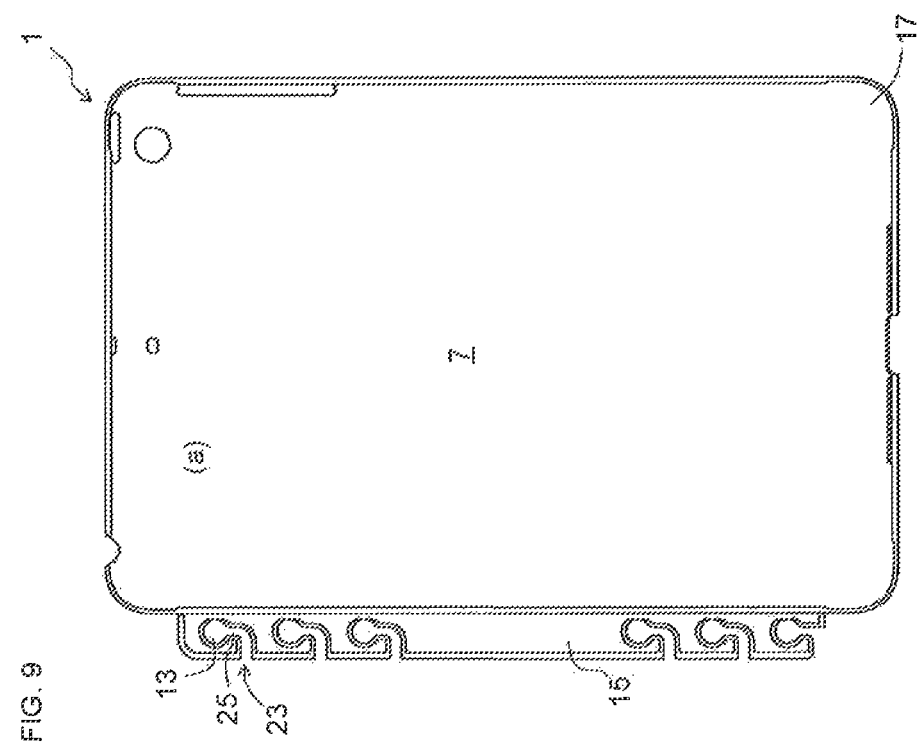

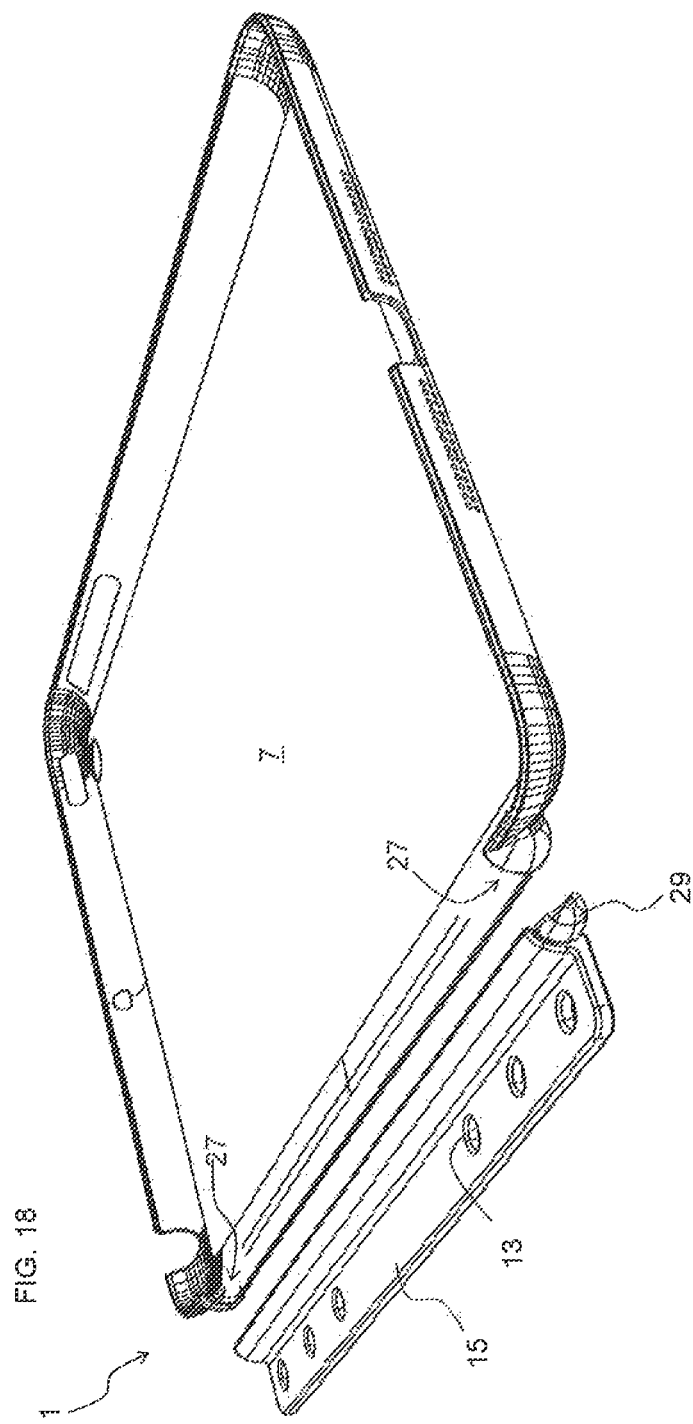

TABLET TERMINAL ATTACHMENT

TECHNICAL FIELD

The present invention relates to an attachment for use with tablet terminals.

BACKGROUND ART

Portable tablet terminals, which the user can operate with a touchscreen, are currently available from Apple Inc. and the like. Such tablet terminals are being used for transmission and reception of emails, schedule management, and other purposes. Many users carry tablet terminals in bags and, when necessary, take them out of the bags and use them.

Accordingly, the touchscreen surfaces or back surfaces of their tablet terminals tend to be damaged. For this reason, tablet terminals are sometimes used with a protective film pasted on the touchscreen surface and/or with a back surface cover as disclosed in Patent Literature 1 attached to the back surface.

PRIOR ART LITERATURE

Patent Literature

[Patent Literature 1] JPU3170512

SUMMARY OF INVENTION

Technical Problem

Use of such a protective film and/or back surface protective cover substantially solves the tablet terminal damaging problem. On the other hand, the inventors became aware of problems with the extreme slimness of tablet terminals: when the user attempts to take documents out of the bag, the tablet terminal sandwiched between the documents may pop up together and fall on the ground; and when the tablet terminal is lost in the documents, the user may have difficulty in soon finding the tablet terminal in the bag. When tablet terminals become slimmer in future, these problems would become more serious.

The present invention has been made in view of the foregoing, and an object thereof is to provide an attachment for use with tablet terminals which prevents a tablet terminal from unexpectedly popping up and allows the user to soon find the tablet terminal in the bag.

Solution to Problem

The present invention provides an attachment for use with tablet terminals. The attachment includes a terminal holding part configured to detachably hold a tablet terminal having a touchscreen surface and a ring insertion part which allows the terminal holding part to be held on a personal organizer having a ring (or rings).

When the inventors were intensively conducting research to solve these problems, they unexpectedly noted a personal organizer in a bag. A personal organizer and a tablet terminal are usually handled as completely separate items. However, the inventors hit on an idea that if a tablet terminal was made a part of a personal organizer, the tablet terminal would be prevented from unexpectedly popping up out of the bag, as well as being lost in the bag. Based on this idea, the inventors found that use of the above attachment allowed a tablet terminal to be integrated with a personal organizer, thereby completing the present invention.

Various embodiments of the present invention are exemplified below. Any embodiments below can be combined with each other.

Preferably, the ring insertion part is disposed in a protruding piece disposed on a side of the terminal holding part.

Preferably, the protruding piece is molded integrally with the terminal holding part.

Preferably, the protruding piece is detachable from the terminal holding part.

Preferably, the terminal holding part has an engaging recess for attaching the protruding piece; the protruding piece has an engaging protrusion that can be engaged with the engaging recess; and when the engaging protrusion is engaged with the engaging recess, the protruding piece is attached to the terminal holding part.

Preferably, in a state in which the tablet terminal is detached from the terminal holding part, the engaging protrusion is detachable from the engaging recess; and when the tablet terminal is attached to the tablet terminal with the engaging protrusion engaged with the engaging recess, the engaging protrusion is fixed to the engaging recess.

Preferably, in a state in which the protruding piece is separated from the terminal holding part, the engaging recess serves as a separation preventing part for preventing separation between a detachable touchscreen cover and the tablet terminal, by covering an attaching part of the touchscreen cover, the touchscreen cover covering the touchscreen surface, the attaching part being intended to attach the touchscreen cover to the tablet terminal.

Preferably, the terminal holding part holds the tablet terminal, as well as protects the back of the tablet terminal.

Preferably, the terminal holding part is elastically engaged with a corner of the tablet terminal to hold the tablet terminal, as well as protects the back of the tablet terminal; the ring insertion part is disposed in a protruding piece disposed on a side of the terminal holding part; and the protruding piece is molded integrally with the terminal holding part.

Preferably, the terminal holding part includes a hinge and can be used as a stand for the tablet terminal in a state in which the terminal holding part is bent at the hinge.

Preferably, the hinge is disposed approximately in parallel with a side of the terminal holding part and approximately in the center of the terminal holding part.

The present invention also provides a protruding piece including a ring insertion part that allows a terminal holding part to be held on a personal organizer including a ring, the terminal holding part detachably holding a tablet terminal. The protruding piece has an engaging protrusion that can be engaged with a separation preventing part of the terminal holding part, and the separation preventing part covers at least part of an attaching part of a detachable touchscreen cover to prevent separation between the touchscreen and the tablet terminal, the attaching part being intended to attach the touchscreen cover to the tablet terminal, the touchscreen cover covering a touchscreen surface of the tablet terminal.

BRIEF DESCRIPTION OF THE DRAWINGS

FIG. 3 includes diagrams showing an attachment for use with tablet terminals of a second embodiment of the present invention, in which FIG. 3(a) is a front view, FIG. 3(b) is a right side view, FIG. 3(c) is a left side view, FIG. 3(d) is a back view, FIG. 3(e) is a plan view, and FIG. 3(f) is a bottom view.

FIG. 6 includes diagrams showing an attachment for use with tablet terminals of a third embodiment of the present invention, in which FIG. 6(a) is a front view, FIG. 6(b) is a right side view, FIG. 6(c) is a left side view, FIG. 6(d) is a back view, FIG. 6(e) is a plan view, FIG. 6(f) is a bottom view, and FIG. 6(g) is a sectional end surface view taken along line C-C of FIG. 6(a).

FIG. 7 includes diagrams showing the terminal holding part of the attachment for use with tablet terminals of FIG. 6, in which FIG. 7(a) is a front view, FIG. 7(b) is a right side view, FIG. 7(c) is a left side view, FIG. 7(d) is a back view, FIG. 7(e) is a plan view, and FIG. 7(f) is a bottom view.

FIG. 8 is a front view showing a state in which the protruding piece and terminal holding part of the attachment for use with tablet terminals of FIG. 6 are separated from each other.

FIG. 9 is a front view showing an attachment for use with tablet terminals of a fourth embodiment of the present invention and corresponds to FIG. 1(a).

FIG. 10 is a front view showing an attachment for use with tablet terminals of a fifth embodiment of the present invention and corresponds to FIG. 1(a).

FIG. 12 includes diagrams showing the terminal holding part 7 and protruding piece 15 in the state of FIG. 11, in which FIG. 12(a) is a front view, FIG. 12(b) is a right side view, FIG. 12(c) is a left side view, FIG. 12(d) is a back view, FIG. 12(e) is a plan view, and FIG. 12(f) is a bottom view.

FIG. 18 is a perspective view showing a state in which a terminal holding part 7 and protruding piece 15 are separated from each other in an attachment for use with tablet terminals of a seventh embodiment of the present invention.

DESCRIPTION OF EMBODIMENTS

Now, embodiments of the present invention will be described with reference to FIGS. 1 to 18. Note that the embodiments are illustrative only and do not limit the scope of the present invention.

1. First Embodiment

Figure 1:
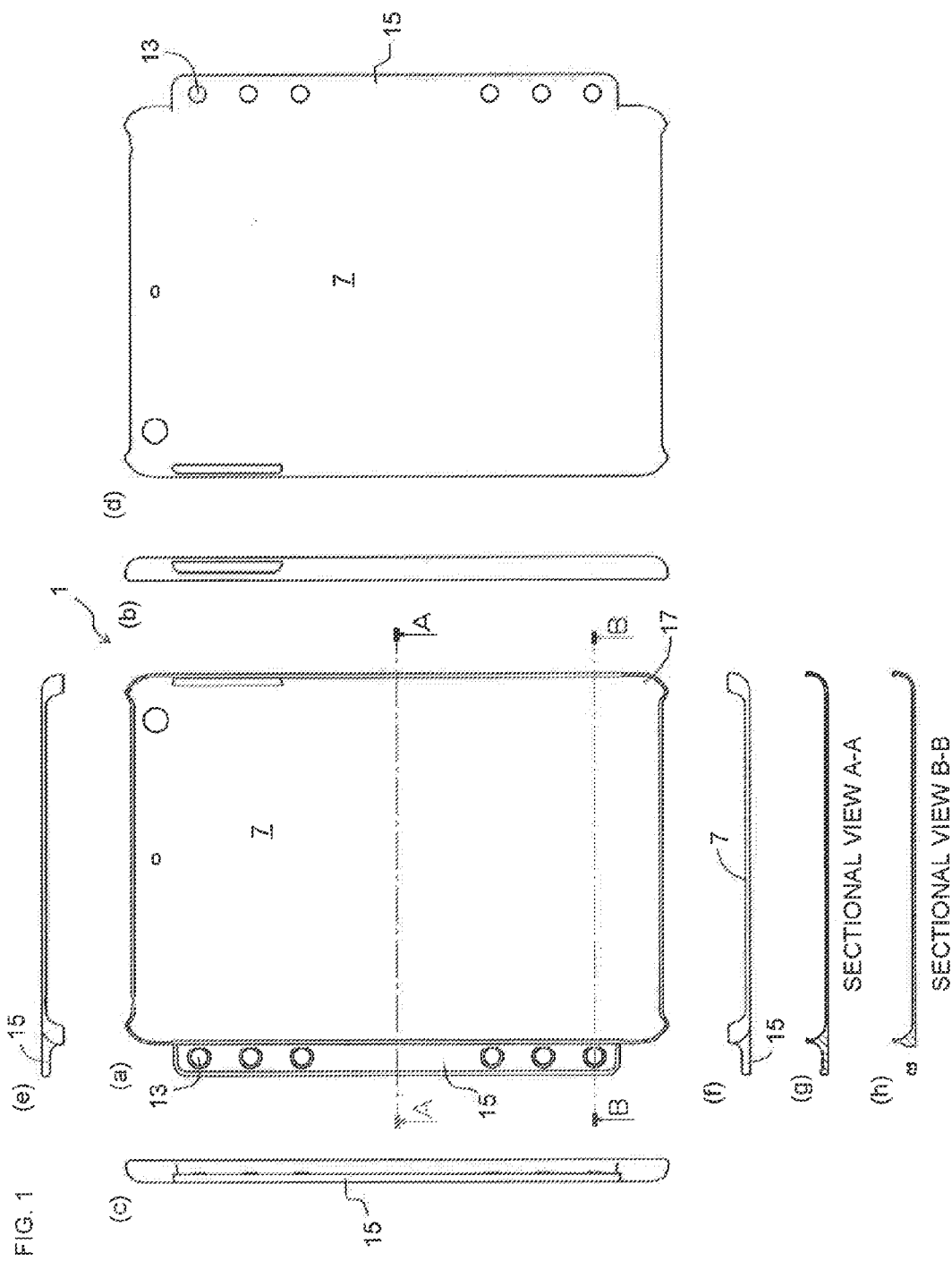
FIG. 1 includes diagrams showing an attachment for use with tablet terminals of a first embodiment of the present invention, in which FIG. 1(*a*) is a front view, FIG. 1(*b*) is a right side view, FIG. 1(*c*) is a left side view, FIG. 1(*d*) is a back view, FIG. 1(*e*) is a plan view, FIG. 1(*f*) is a bottom view, FIG. 1(*g*) is a sectional end surface view taken along line A-A, and FIG. 1(*h*) is a sectional end surface view taken along line B-B.
Figure 2:
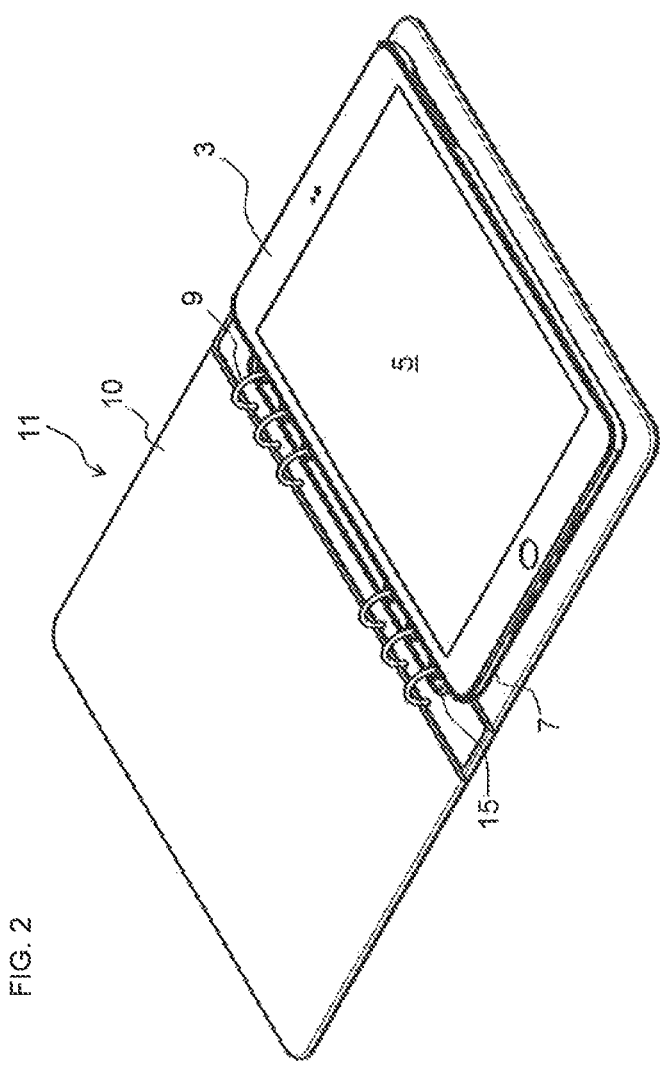
FIG. 2 is a perspective view showing a state in which a tablet terminal attached to the attachment of FIG. 1 is attached to a personal organizer.

As shown in FIGS. 1 and 2, an attachment 1 for tablet terminals of a first embodiment of the present invention includes a terminal holding part 7 configured to detachably hold a tablet terminal 3 and a ring insertion part 13 that allows the terminal holding part 7 to be held on a personal organizer 11 including a ring 9. The ring insertion part 13 is disposed in a protruding piece 15 disposed on a side of the terminal holding part 7. In the present embodiment, the protruding piece 15 is molded integrally with the terminal holding part 7. The terminal holding part 7 holds the tablet terminal 3, as well as protects the back and sides of the tablet terminal 3. In the present embodiment, the terminal holding part 7 includes an elastic engaging part 17 configured to be elastically engaged with four corners and sides of the tablet terminal 3. The tablet terminal 3 is held on the terminal holding part 7 with the elastic engaging part 17 engaged with the tablet terminal 3.

Specifically, the user engages the tablet terminal 3 with the elastic engaging part 17 of the terminal holding part 7 of the attachment 1 so the tablet terminal 3 is held on the terminal holding part 7, and then inserts the ring 9 of the personal organizer 11 into the ring insertion part 13. In this way, the user can integrate the tablet terminal 3 with the personal organizer 11.

As seen above, by integrating the tablet terminal 3 with the personal organizer 11, the tablet terminal 3 is prevented from unexpectedly popping up from the bag or being lost therein. Further, the cover 10 of the personal organizer 11 serves as a protective cover for a touchscreen surface 5, eliminating the need to separately purchase a touchscreen protective cover for the tablet terminal 3.

The tablet terminal 3 may be used in a manner integrated with the personal organizer 11, or may be detached along with the attachment 1 from the personal organizer 11 and then used. Or, with the attachment 1 attached to the personal organizer 11, the tablet terminal 3 may be detached from the attachment 1 and then used. Considering the case where the user uses the tablet terminal 3 integrated with the personal organizer 11, the terminal holding part 7 preferably holds the tablet terminal 3 in a manner that does not hinder the user from operating the touchscreen surface 5 of the tablet terminal 3.

The material of the attachment 1 is not particularly limited and may be a hard resin such as polycarbonate, a soft resin such as urethane, or a material other than resins, such as leather or cloth. The attachment 1 may be transparent or opaque. The method for detachably holding the tablet terminal 3 on the terminal holding part 7 is not particularly limited and may be methods other than the elastic engagement. The terminal holding part 7 only has to have a function of holding the tablet terminal 3 and may not have a function of protecting the back and sides of the tablet terminal 3.

2. Second Embodiment

Figure 3:
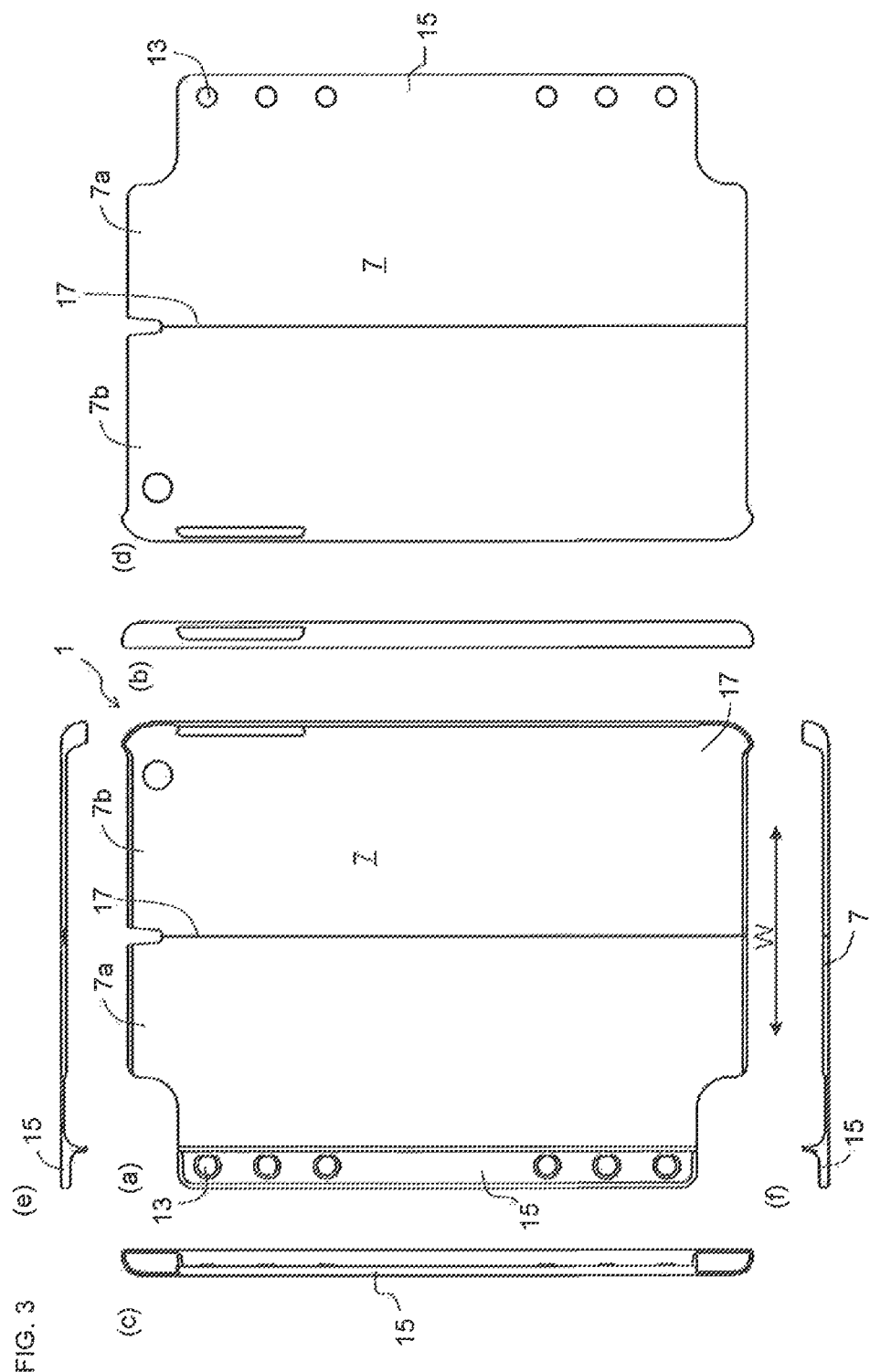
Figure 4:
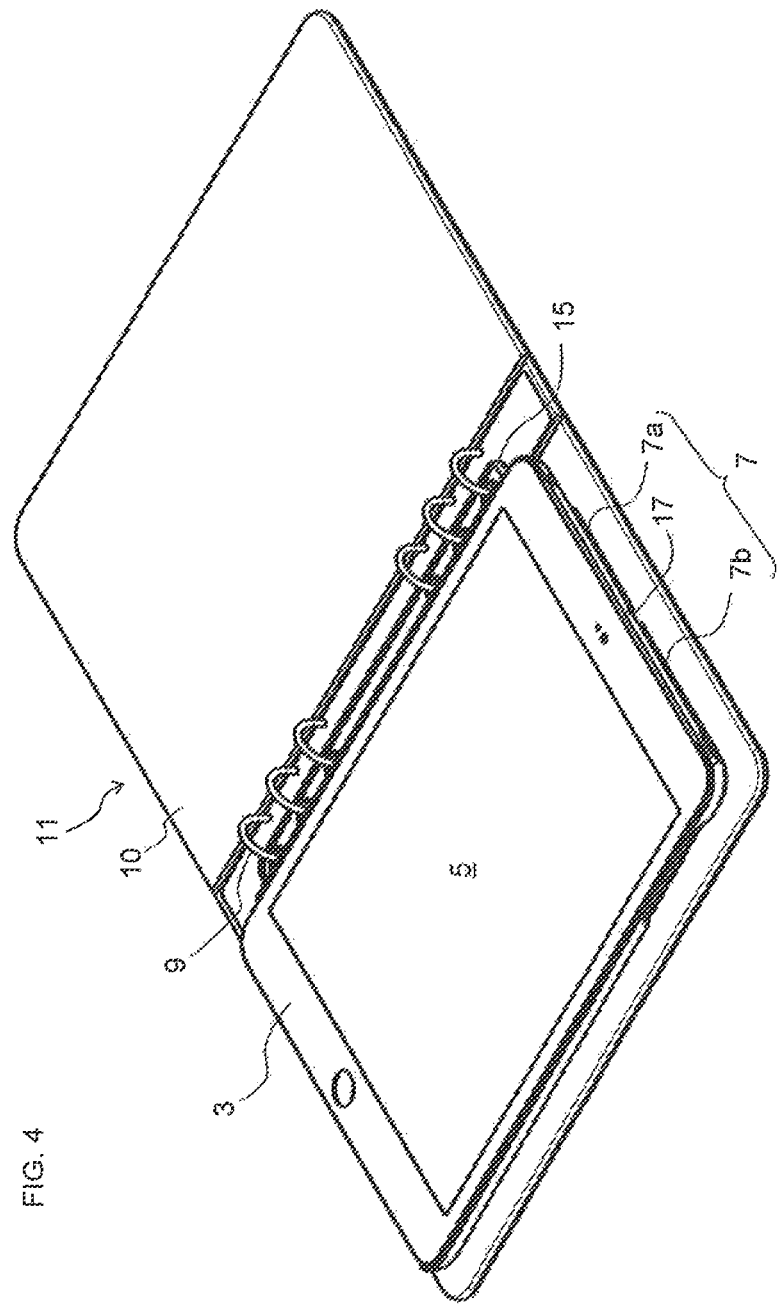
FIG. 4 is a perspective view showing a state in which a tablet terminal attached to the attachment of FIG. 3 is attached to a personal organizer.
Figure 5:
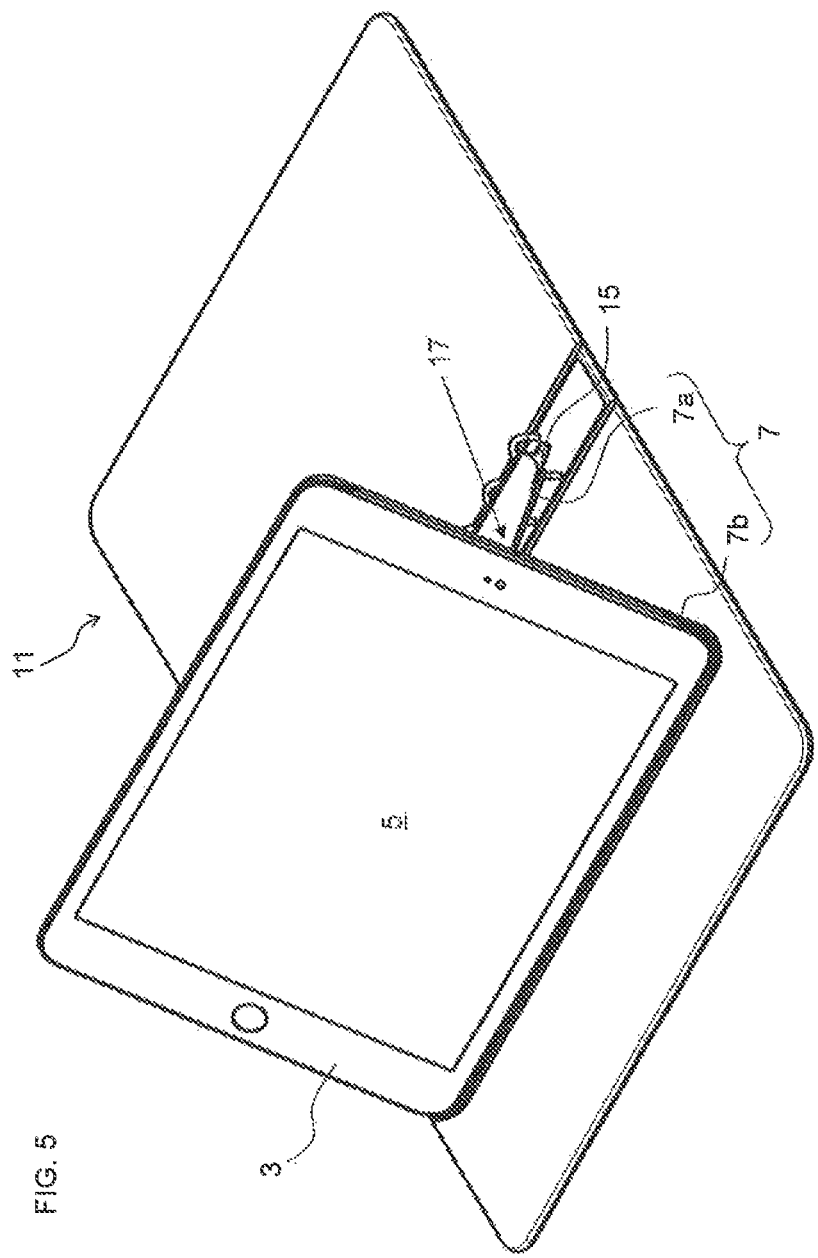
FIG. 5 is a perspective view showing a state in which a tablet terminal attached to the attachment of FIG. 3 is attached to a personal organizer and in which the attachment is being used as a stand with the attachment bent at a hinge.

While an attachment 1 for tablet terminals of a second embodiment of the present invention is similar to that of the first embodiment, a terminal holding part 7 of the second embodiment includes a hinge 17 and can be used as a stand for a tablet terminal 3 with the terminal holding part 7 bent at the hinge 17, as shown in FIGS. 3 to 5. The hinge 17 is disposed approximately in parallel with a side (a side having a protruding piece 15 thereon) of the terminal holding part 7 and approximately in the center of the terminal holding part 7. The terminal holding part 7 is divided by the hinge 17 into two parts: a first part 7*a*, which is adjacent to the protruding piece 15, and a second part 7*b*, which is remote therefrom.

In the first embodiment, the tablet terminal 3 is used in a manner detached from the attachment 1 or in a manner attached thereto. In the present embodiment, on the other hand, by folding the terminal holding part 7 at the hinge 17 and thus detaching only the first part 7*a* of the terminal holding part 7 from the tablet terminal 3, the attachment 1 can be used as a stand consisting of the first part 7*a* and second part 7*b*, as shown in FIG. 5. Use of the attachment 1 in this manner allows the tablet terminal 3 to be held at the desired angle.

The number of hinges 17 is preferably one, but may be two or more. The hinge 17 is preferably located approximately in the center in the width direction (the direction of an arrow W in FIG. 3(*a*)) of the terminal holding part 7, but may be displaced from such a position.

3. Third Embodiment

Figure 6:
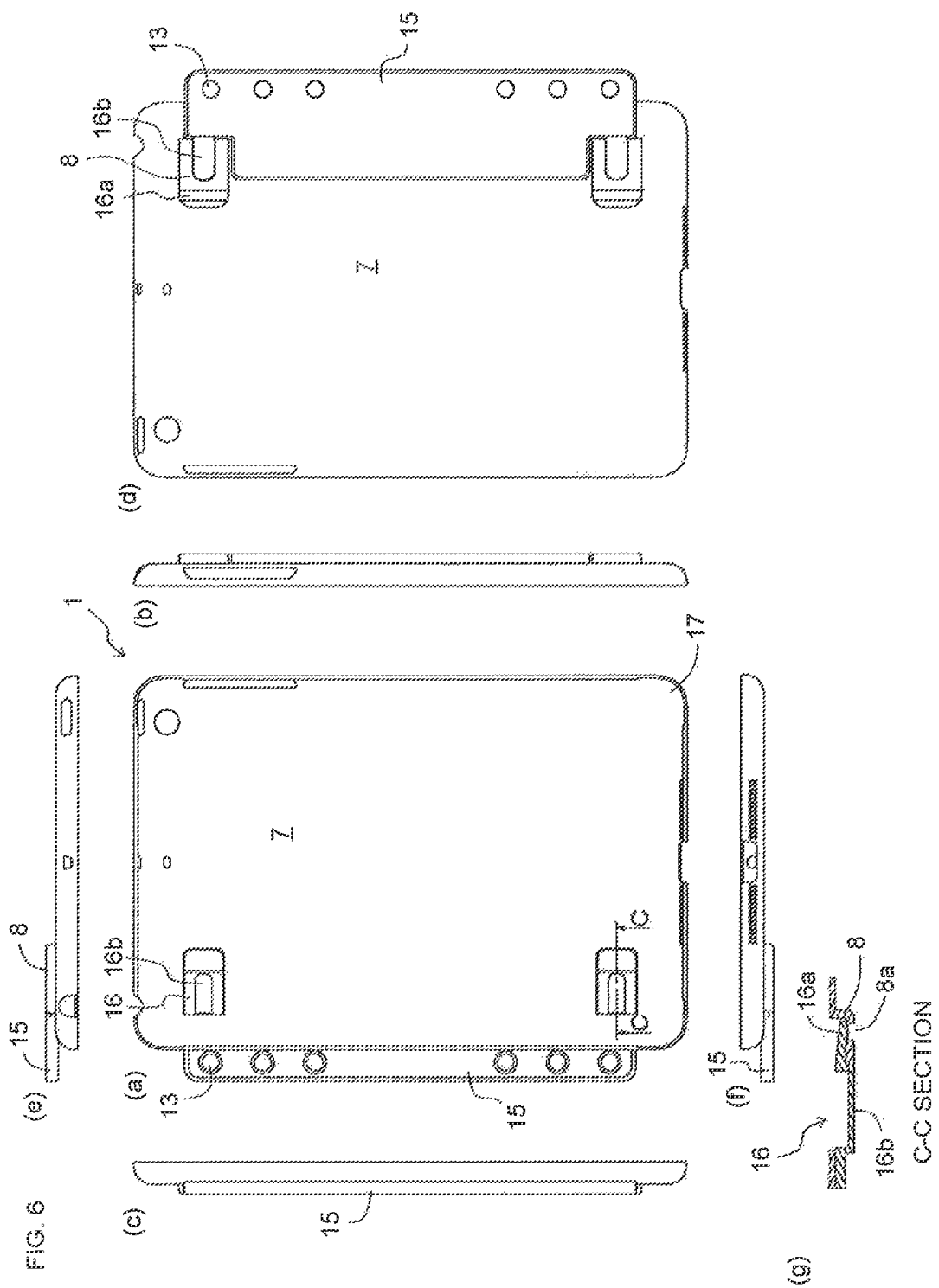
Figure 7:
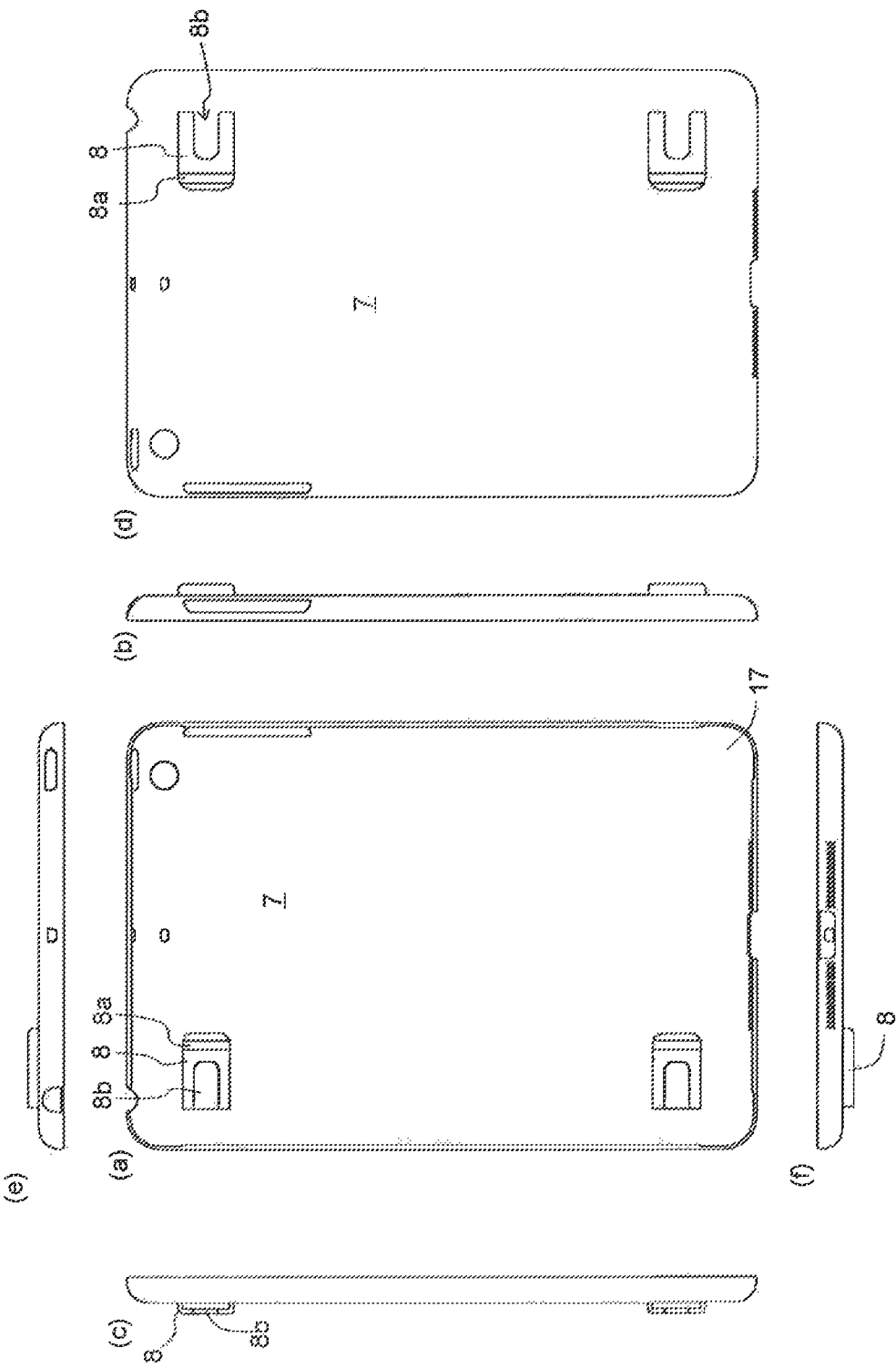

While an attachment 1 for tablet terminals of a third embodiment of the present invention is similar to that of the first embodiment, a protruding piece 15 of the third embodiment is detachable from a terminal holding part 7, as shown in FIGS. 6 to 8.

Specifically, in the present embodiment, the protruding piece 15 includes an engaging tongue 16 configured to be engaged with the terminal holding part 7, and the terminal holding part 7 includes an engaging bag 8 configured to house the engaging tongue 16. The engaging tongue 16 has a front engaging protrusion 16*a* at the front end thereof and a rotation preventing protrusion 16*b* at the base end thereof. The engaging bag 8 has an engaging groove 8*a* configured to be engaged with the front engaging protrusion 16*a* and a rotation preventing groove 8*b* configured to be engaged with the rotation preventing protrusion 16*b*.

The user integrates the protruding piece 15 with the terminal holding part 7 as follows: the user inserts the engaging tongue 16 into the engaging bag 8 to engage the rotation preventing protrusion 16*b* with the engaging groove 8*a*, thereby preventing the relative rotation between the protruding piece 15 and terminal holding part 7; and then the user more deeply inserts the engaging tongue 16 into the engaging bag 8 to elastically engage the front engaging protrusion 16*a* with the engaging groove 8*a*, thereby preventing the engaging tongue 16 from coming out of the engaging bag 8. In this way, the protruding piece 15 is integrated with the terminal holding part 7.

On the other hand, the user separates the protruding piece 15 and terminal holding part 7 from each other as follows: the user holds each of the protruding piece 15 and terminal holding part 7 and then pulls them away from each other to disengage the front engaging protrusion 16*a* and engaging groove 8*a* from each other.

According to the above configuration, where the protruding piece 15 is detachable from the terminal holding part 7, when the user wants to detach the tablet terminal 3 from the personal organizer 11 and then use it, he or she only has to separate the protruding piece 15 from the terminal holding part 7 without having to detach the terminal holding part 7 from the tablet terminal 3. If the terminal holding part 7 serves also as a cover for protecting the back of the tablet terminal 3 as in the present embodiment, the back of the tablet terminal 3 can be prevented from being damaged, by leaving the terminal holding part 7 held on the tablet terminal 3.

The means for making the protruding piece 15 detachable from the terminal holding part 7 is not particularly limited and may be elastic engagement as in the present embodiment, a zipper, or a hook-and-loop fastener (e.g., Velcro).

4. Fourth Embodiment

While an attachment 1 for tablet terminals of a fourth embodiment of the present invention is similar to that of the first embodiment, a ring insertion part 13 of the fourth embodiment is not a closed hole but is opened on a ring introduction path 23 so that a ring 9 can be introduced through the ring introduction path 23, as shown in FIG. 9. In the first embodiment, the ring 9 must be opened to insert the ring 9 into the ring insertion part 13; in the present embodiment, the ring 9 can be inserted into the ring insertion part 13 through the ring introduction path 23 without having to open the ring 9. Further, the ring introduction path 23 has a constriction 25 in a position adjacent to the ring insertion part 13. When the user attempts to insert the ring 9, the constriction 25 is elastically deformed and expanded so that the ring 9 is inserted. Once the ring 9 is inserted, the constriction 25 is restored to its original state, preventing the ring 9 from easily coming off.

As seen above, the ring insertion part 13 may have a shape opening in one direction and is not limited to closed holes or circular shapes. That is, the ring insertion part 13 may have any shape as long as the ring 9 can be inserted thereinto. The number of ring insertion parts 13 is determined as appropriate according to the number of the rings 9 of the target personal organizer 11.

5. Fifth Embodiment

While an attachment 1 for tablet terminals of a fifth embodiment of the present invention is similar to that of the first embodiment, a notch is made in a position corresponding to a side of a tablet terminal 3, of a terminal holding part 7 of the fifth embodiment, as shown in FIG. 10. Accordingly, the terminal holding part 7 protects the back of the tablet terminal 3 but does not protect the side thereof. The terminal holding part 7 holds the tablet terminal 3 only at the four corners thereof. The present invention can be carried out even in such a configuration. The terminal holding part 7 may be one which holds only a side of the tablet terminal 3 and does not protect the back thereof. The terminal holding part 7 may also be one which only partially covers the back of the tablet terminal 3, that is, does not completely protect the back of the tablet terminal 3.

6. Sixth Embodiment

Figure 11:
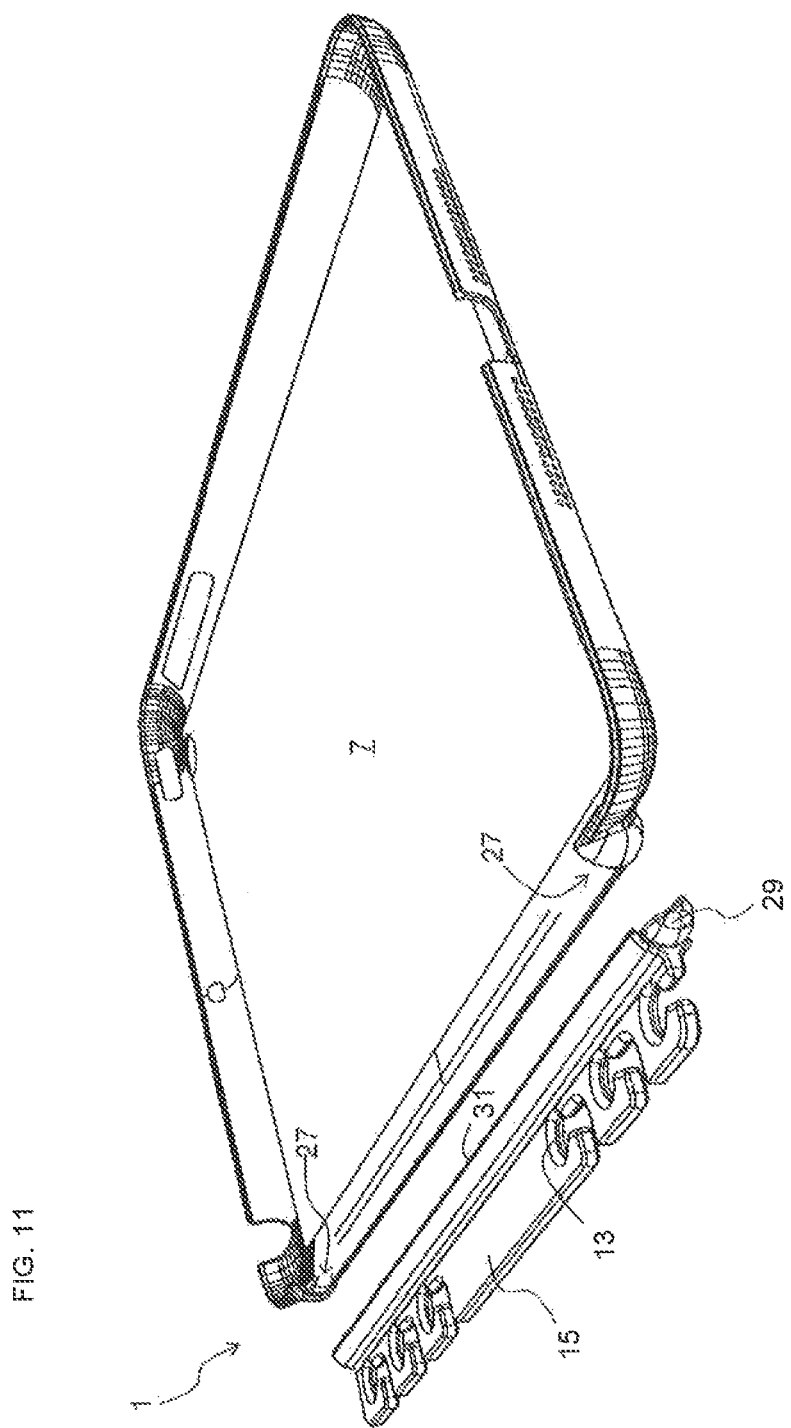
FIG. 11 is a perspective view showing a state in which a terminal holding part 7 and protruding piece 15 are separated from each other in an attachment for use with tablet terminals of a sixth embodiment of the present invention.
Figure 12:
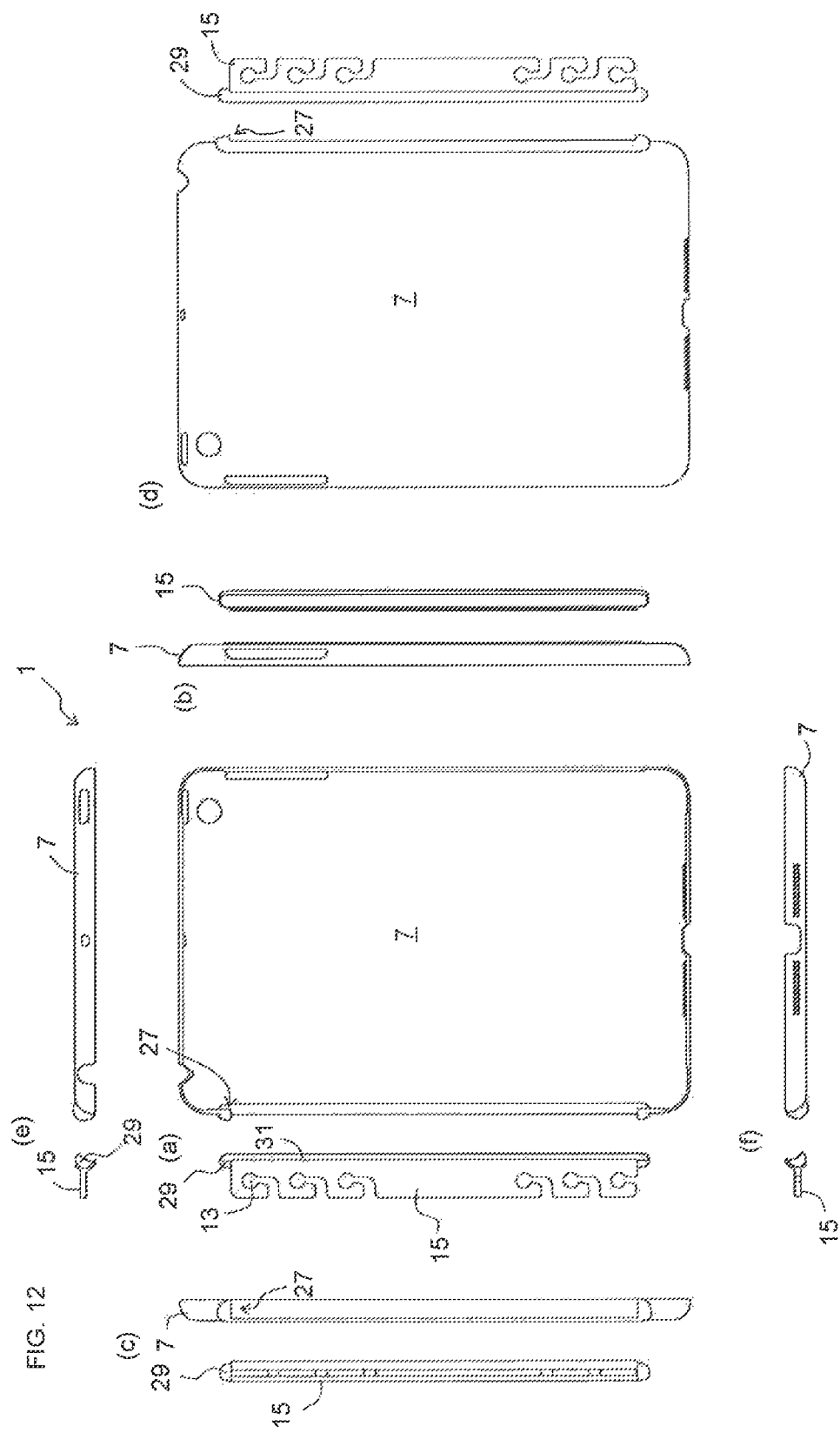
Figure 13:
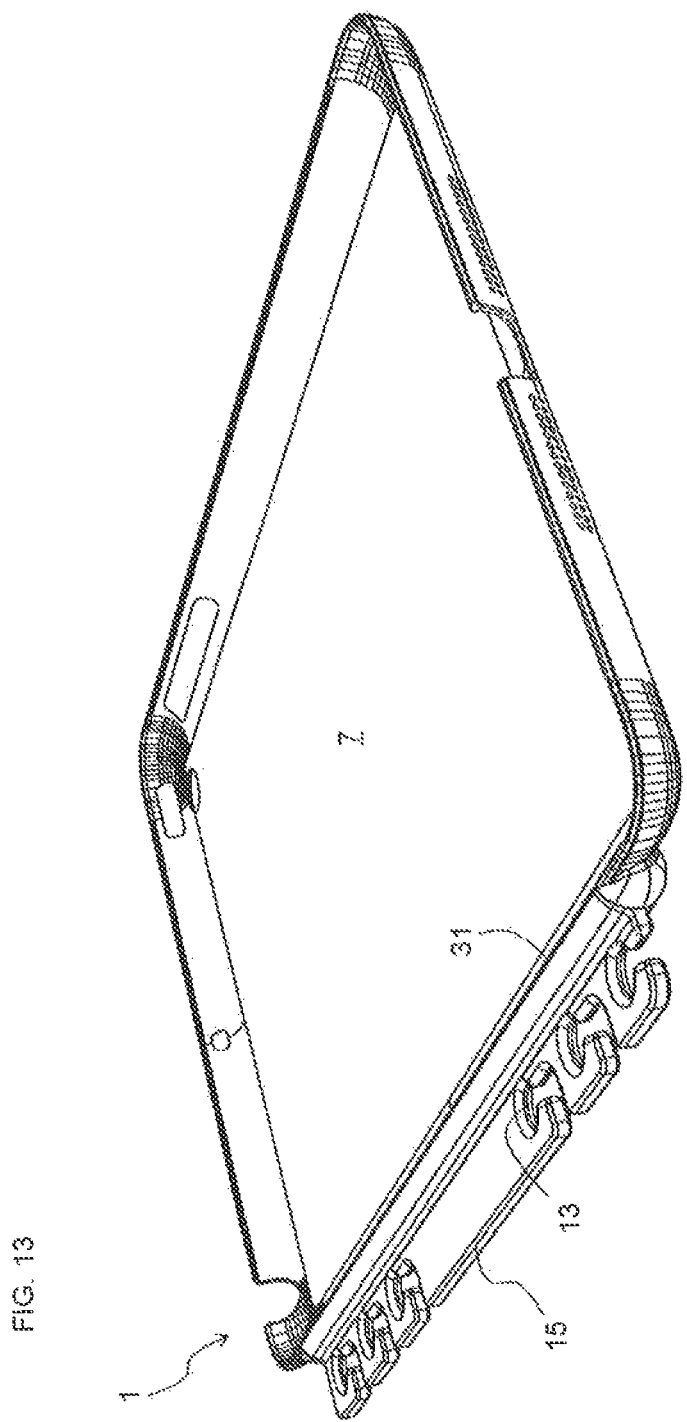
FIG. 13 shows a state in which the protruding piece 15 is attached to the terminal holding part 7 in the attachment for use with tablet terminals of the sixth embodiment of the present invention.
Figure 14:
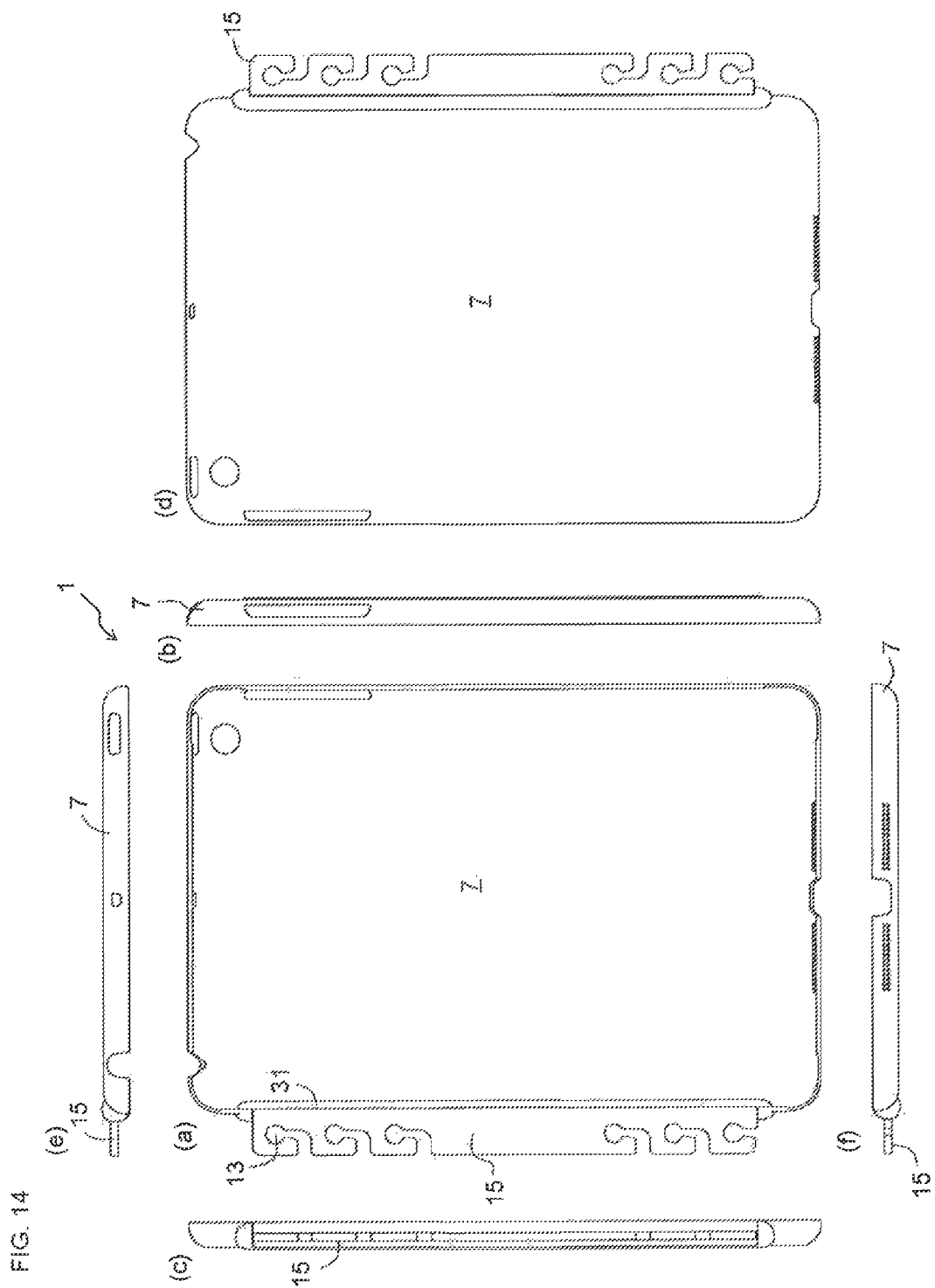
FIG. 14 includes diagrams showing the terminal holding part 7 and protruding piece 15 in the state of FIG. 13, in which FIGS. 14(a) to 14(f) correspond to FIGS. 12(a) to 12(f).

While an attachment 1 for tablet terminals of a sixth embodiment of the present invention is similar to that of the fourth embodiment, a protruding piece 15 of the sixth embodiment is removable, as shown in FIGS. 11 to 14. Specifically, a terminal holding part 7 has an engaging recess 27 for attaching the protruding piece 15, and the protruding piece 15 has an engaging protrusion 29 configured to be engaged with the engaging recess 27. When the engaging protrusion 29 is engaged with the engaging recess 27, the protruding piece 15 is attached to the terminal holding part 7. As shown in FIGS. 11 and 12, the inner surface of the engaging recess 27 has an approximately spherical shape, and the outer surface of the engaging protrusion 29 has an approximately spherical shape. When the engaging protrusion 29 is engaged with the engaging recess 27, the protruding piece 15 is attached to the terminal holding part 7, as shown in FIGS. 13 and 14. In the present embodiment, the engaging protrusion 29 is gently engaged with the engaging recess 27 and therefore the engaging protrusion 29 is freely removable in a state in which the tablet terminal 3 is not attached to the terminal holding part 7

Figure 15:
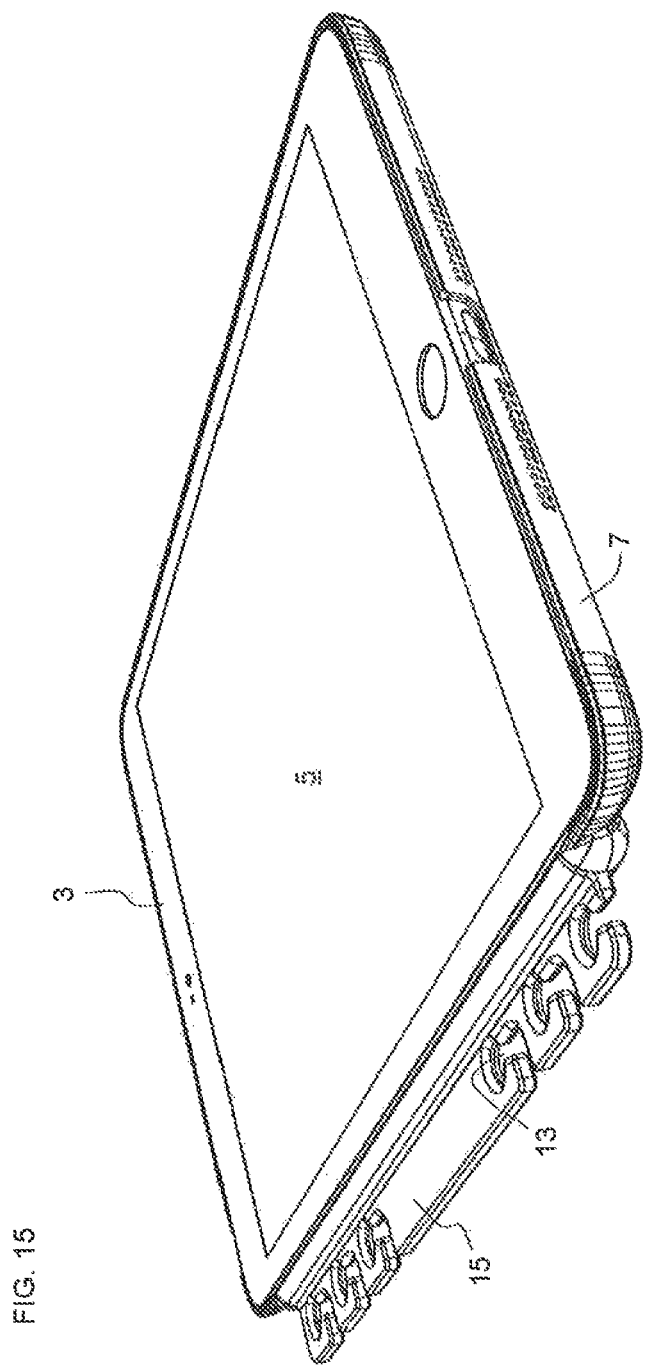
FIG. 15 is a perspective view showing a state in which the protruding piece 15 is attached to the terminal holding part 7 in the attachment for use with tablet terminals of the sixth embodiment of the present invention and in which the tablet terminal 3 is attached to the terminal holding part 7.

(the state of FIGS. 13 and 14). As shown in FIG. 15, when the tablet terminal is attached to the terminal holding part 7, a side of the tablet terminal 3 is brought into contact with a side 31 of the protruding piece 15. Thus, the engaging protrusion 29 no longer comes off from the engaging recess 27 and is fixed thereto. Alternatively, the engaging protrusion 29 may be prevented from coming off from the engaging recess 27 even in a state in which the tablet terminal 3 is not attached to the terminal holding part 7, for example, by disposing a protrusion in the engaging recess 27a and engaging this protrusion with a recess disposed in the engaging protrusion 29.

Figure 16:
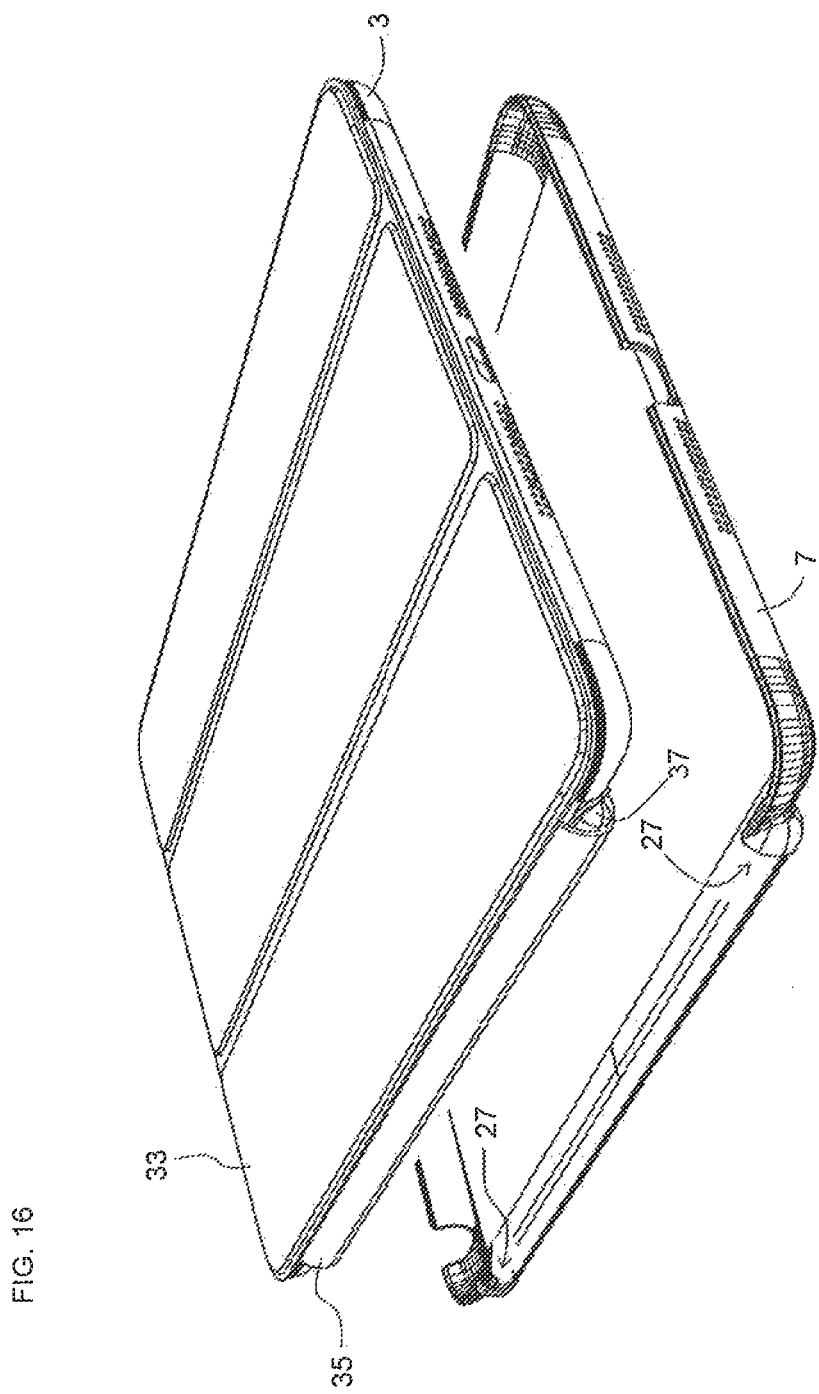
FIG. 16 is a perspective view showing a state in which the protruding piece 15 is not attached to the terminal holding part 7 in the attachment for use with tablet terminals of the sixth embodiment of the present invention and in which the tablet terminal 3 is about to be attached to the terminal holding part 7.

For tablet terminals 3 such as iPad mini, a detachable touchscreen cover for protecting @ the touchscreen surface 5 (e.g., Smart Cover) is commercially available. As shown in FIG. 16, a touchscreen cover 33 includes an attaching part 35 made of a magnet and is attached to sides of the tablet terminal 3 using a magnetic force. Accordingly, when the user grasps and lifts only the touchscreen cover 33, the touchscreen cover 33 may come off from the tablet terminal 3, resulting in a fall of the tablet terminal 3.

Figure 17:
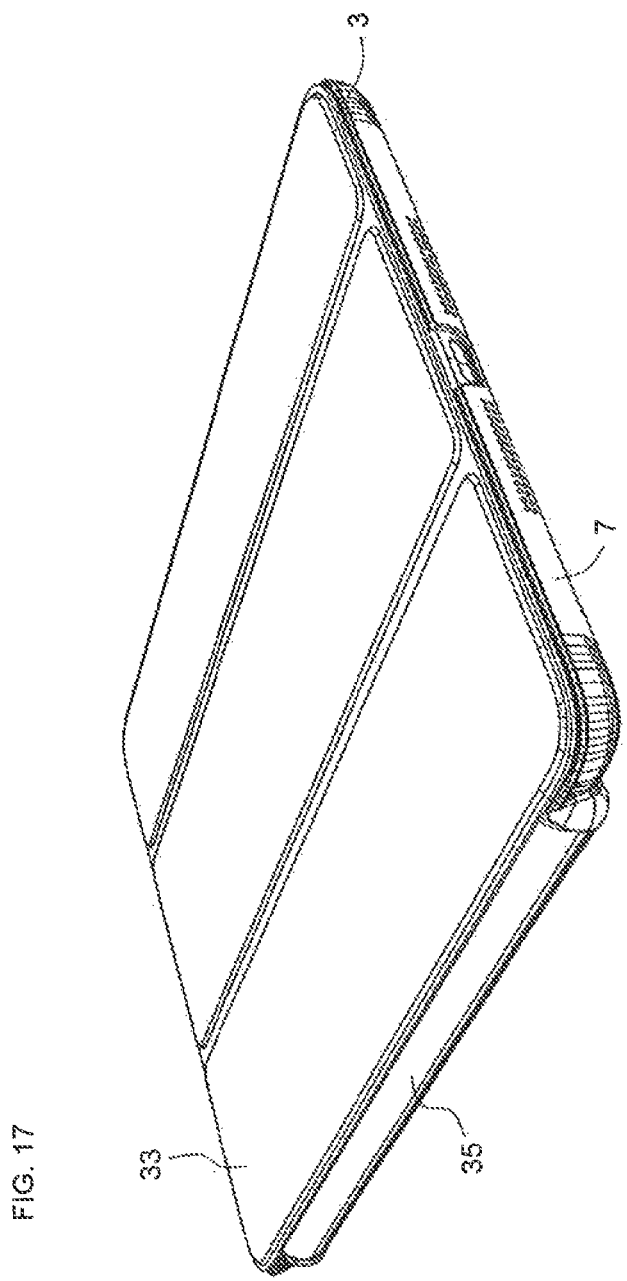
FIG. 17 is a perspective view showing a state in which the tablet terminal 3 has been attached to the terminal holding part 7 after the state of FIG. 16.

In the present embodiment, on the other hand, in a state in which the protruding piece 15 is separated from the terminal holding part 7 (the state of FIG. 16), the engaging recess 27 covers an end 37 of the attaching part 35 and thus serves as a separation preventing part for preventing the separation between the touchscreen cover 33 and tablet terminal 3. Thus, as shown in FIG. 17, when the tablet terminal 3 covered by the touchscreen cover 33 is attached to the terminal holding part 7, the end 37 of the attaching part 35 of the touchscreen cover 33 enters the engaging recess 27, thereby preventing the touchscreen cover 33 from coming off from the tablet terminal 3.

As seen above, the engaging recess 27 can play two roles: when the protruding piece 15 is attached to the terminal holding part 7, the engaging recess 27 houses the engaging protrusion 29 of the protruding piece 15 to fix the protruding piece 15 to the terminal holding part 7; and in a state in which the protruding piece 15 is detached from the terminal holding part 7, the engaging recess 27 serves as a separation preventing part for preventing the touchscreen cover 33 from coming off from the tablet terminal 3.

7. Seventh Embodiment

While an attachment 1 for tablet terminals of a seventh embodiment is similar to that of the sixth embodiment, a ring insertion part 13 disposed in a protruding piece 15 is a closed hole in the seventh embodiment, as shown in FIG. 18. The method for fixing the protruding piece 15 to the terminal holding part 7 is the same as that of the sixth embodiment.

DESCRIPTION OF REFERENCE SIGNS

1: attachment for tablet terminal, 3: tablet terminal, 5: touchscreen surface, 7: terminal holding part, 9: ring, 11: personal organizer, 13: ring insertion part, 15: protruding piece, 17: elastic engaging part, 23: ring introduction path, 25: constriction, 27: engaging recess, 29: engaging protrusion, 31: side, 33: touchscreen cover, 35: attaching part, 37: end of attaching part

The invention claimed is:

1. An attachment for use with tablet terminals, comprising:
a terminal holding part configured to detachably hold a tablet terminal having a touchscreen surface; and
a ring insertion part which allows the terminal holding part to be held on a personal organizer having a ring, the ring insertion part is disposed in a protruding piece disposed on a side of the terminal holding part;
wherein the terminal holding part has an engaging recess for attaching the protruding piece,
wherein the protruding piece has an engaging protrusion which can be engaged with the engaging recess, and
wherein when the engaging protrusion is engaged with the engaging recess, the protruding piece is attached to the terminal holding part,
wherein in a state in which the tablet terminal is detached from the terminal holding part, the engaging protrusion is detachable from the engaging recess,
wherein when the tablet terminal is attached to the terminal holding part with the engaging protrusion engaged with the engaging recess, the engaging protrusion is fixed to the engaging recess; and
wherein in a state in which the protruding piece is separated from the terminal holding part, the engaging recess serves as a separation preventing part for preventing separation between a detachable touchscreen cover and the tablet terminal, by covering an attaching part of the touchscreen cover, the touchscreen cover covering the touchscreen surface, the attaching part being intended to attach the touchscreen cover to the tablet terminal.

2. The attachment of claim 1, wherein the terminal holding part holds the tablet terminal, as well as protects the back of the tablet terminal.

3. The attachment of claim 1, wherein the terminal holding part is elastically engaged with a corner of the tablet terminal to hold the tablet terminal, as well as protects the back of the tablet terminal, wherein the ring insertion part is disposed in a protruding piece disposed on a side of the terminal holding part.

4. The attachment of claim 1, wherein the terminal holding part comprises a hinge and can be used as a stand for the tablet terminal in a state in which the terminal holding part is bent at the hinge.

5. The attachment of claim 1, wherein the hinge is disposed approximately in parallel with a side of the terminal holding part and approximately in the center of the terminal holding part.

* * * * *